(12) United States Patent
Han et al.

(10) Patent No.: US 7,758,349 B2
(45) Date of Patent: Jul. 20, 2010

(54) MAGNETIC COMPONENT CONNECTOR, CIRCUIT BOARDS FOR USE THEREWITH, AND KITS FOR BUILDING AND DESIGNING CIRCUITS

(75) Inventors: In Suk Han, Sandy, UT (US); Dong-Kyun Lim, Kyeonggi-Do (KR); Iisun Park, Kyeonggi-Do (KR)

(73) Assignee: MR Board, Inc., Sandy, UT (US)

( * ) Notice: Subject to any disclaimer, the term of this patent is extended or adjusted under 35 U.S.C. 154(b) by 0 days.

(21) Appl. No.: 12/611,015

(22) Filed: Nov. 2, 2009

(65) Prior Publication Data
US 2010/0048038 A1 Feb. 25, 2010

Related U.S. Application Data

(63) Continuation of application No. 11/788,369, filed on Apr. 18, 2007, now Pat. No. 7,611,357, which is a continuation-in-part of application No. PCT/KR2006/003696, filed on Sep. 15, 2006, now abandoned.

(60) Provisional application No. 60/856,417, filed on Nov. 3, 2006.

(51) Int. Cl.
*G09B 19/00* (2006.01)
*H01R 11/00* (2006.01)

(52) U.S. Cl. ........................ 439/39; 434/224
(58) Field of Classification Search ............... 439/39, 439/40, 700; 434/118, 224, 301, 379; 335/205, 335/207
See application file for complete search history.

(56) References Cited

U.S. PATENT DOCUMENTS

| | | | |
|---|---|---|---|
| 1,995,172 A | 3/1935 | Douglas | |
| 3,038,139 A * | 6/1962 | Bonanno | 439/40 |
| 3,175,304 A | 3/1965 | Och et al. | |
| 3,411,665 A | 11/1968 | Blum | |
| 3,706,882 A * | 12/1972 | Eby | 362/398 |
| 3,845,573 A * | 11/1974 | Kasamatsu | 434/224 |
| 4,752,756 A | 6/1988 | Bartel | |
| 4,863,757 A | 9/1989 | Durand | |

(Continued)

FOREIGN PATENT DOCUMENTS

KR 10-1999-0007762 1/1999

(Continued)

*Primary Examiner*—Neil Abrams
(74) *Attorney, Agent, or Firm*—Thorpe North & Western LLP

(57) ABSTRACT

Printed circuit boards and breadboard devices have contact pads and magnetic component connectors where connection between the contact pads and the magnetic component connectors are made by magnetic force. Either the contact pad or the magnetic component connector will be magnetic and the other will be made of a material to which a magnet will be attracted. For example, printed circuit boards, which usually have copper traces, include contact pads made of a material to which a magnet will be attracted. Circuit components are connected to magnetic component connectors having magnetic legs which then connect the components to the contact pads of the circuit board or breadboard device. This makes the connection of components to a printed circuit board or breadboard device fast and easy and provides for easy removal and replacement of components. Magnetic component connectors can also be configured to connect magnetically to one another.

18 Claims, 11 Drawing Sheets

U.S. PATENT DOCUMENTS

| | | | |
|---|---|---|---|
| 5,481,436 | A | 1/1996 | Werther |
| 5,742,486 | A | 4/1998 | Yangkuai |
| 6,449,167 | B1 | 9/2002 | Seymour |
| 6,650,548 | B1 | 11/2003 | Swetland |
| 6,663,440 | B2 | 12/2003 | Cox et al. |
| 6,814,626 | B2 | 11/2004 | Wen-yao |
| 6,910,894 | B2 | 6/2005 | Basconi |
| 7,144,255 | B2 | 12/2006 | Seymour |
| 7,611,357 | B2 | 11/2009 | Han et al. |
| 2003/0043554 | A1 | 3/2003 | Seymour |
| 2003/0232522 | A1 | 12/2003 | Buondelmonte et al. |
| 2004/0229489 | A1 | 11/2004 | Lu |
| 2005/0036264 | A1 | 2/2005 | Aguilar |

FOREIGN PATENT DOCUMENTS

| | | |
|---|---|---|
| KR | 10-2003-0083 691 | 10/2003 |
| KR | 20-0330521 | 10/2003 |

* cited by examiner

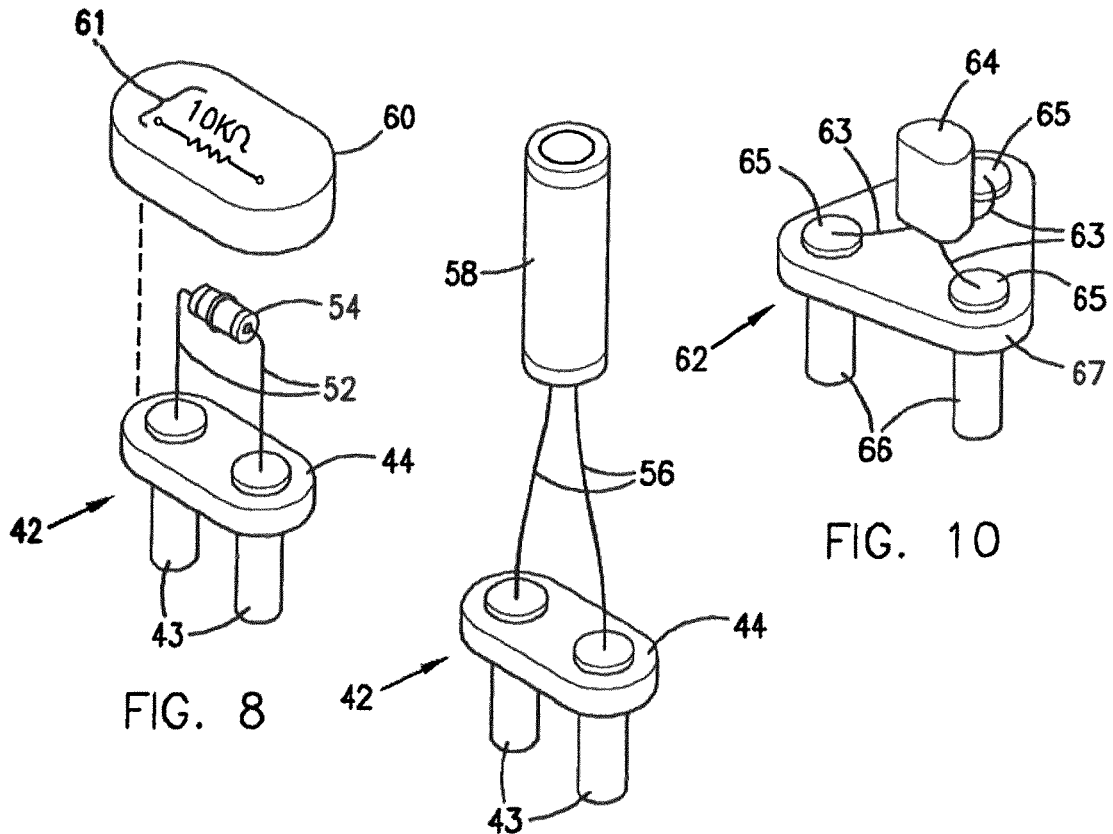
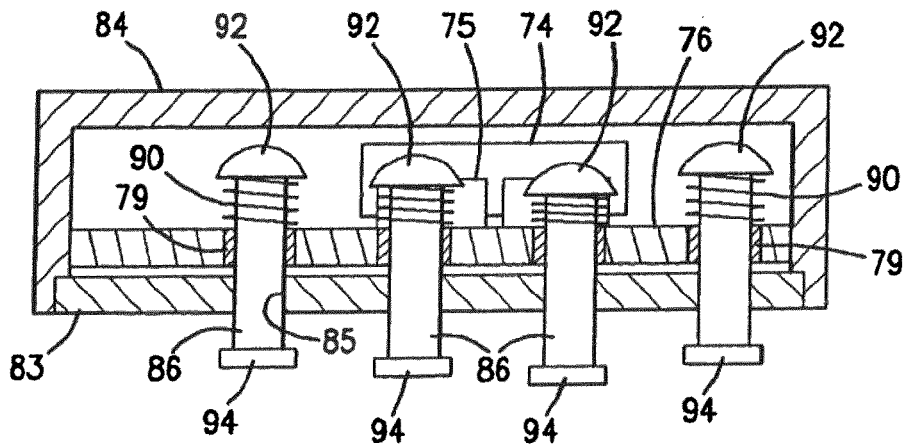

US 7,758,349 B2

MAGNETIC COMPONENT CONNECTOR, CIRCUIT BOARDS FOR USE THEREWITH, AND KITS FOR BUILDING AND DESIGNING CIRCUITS

RELATED APPLICATIONS

This application is a continuation of application Ser. No. 11/788,369 filed Apr. 18, 2007 and entitled Magnetic Component Connector, Circuit Boards for Use Therewith, and Kits for Building and Designing Circuits, now U.S. Pat. No. 7,611,357, which was a continuation-in-part of PCT application No. PCT/KR2006/003696, filed Sep. 15, 2006, entitled "Electrical Components and Breadboard for Electronic Circuit Study Kit", incorporated herein by reference, and which claimed the benefit of Provisional Application Ser. No. 60/856,417 filed Nov. 3, 2006, and entitled "Magnetic Component Connector For Printed Circuit Boards", incorporated herein by reference.

BACKGROUND OF THE INVENTION

1. Field

The invention is in the field of assembling electronic circuits, and particularly assembling electronic circuits on printed circuit boards and on breadboard devices. The invention is also in the field of kits for building electronic circuits and component parts for building electronic circuits.

2. State of the Art

It is common practice in assembling electronic circuits to lay out and form conductive traces on a broad side of a printed circuit board with the traces laid out to connect individual circuit components. Usually the conductive traces are formed on one side of the printed circuit board, referred to herein as the back side of the printed circuit board. Holes extend through the printed circuit board and through conductive pads of the conductive traces formed around each hole on the back side of the printed circuit board. The individual electronic components required for the circuit are usually attached to the opposite side of the printed circuit board, referred to herein as the front side, by passing the leads of the components through appropriate holes in the printed circuit board from the front side and attaching the leads to the conductive pads of the traces on the back side, usually by soldering the leads to the conductive pads surrounding the hole through which the lead is passed. After soldering, any excess length of the component lead extending beyond the solder joint is usually cut off.

Where circuits are assembled on a mass production basis, automated soldering equipment is used. However, in many instances, a circuit is hand soldered by a person assembling the circuit. This is particularly true where electronic kits are provided for educational purposes or where a new circuit is being designed and tested. For example, a kit for a particular type of circuit, such as a radio, may be given to or otherwise obtained by a child to assemble for educational purposes. The kit will usually include a printed circuit board and the necessary electronic components to be connected by soldering to the printed circuit board to make the desired circuit. The soldering of the components is usually not an essential learning step to be performed by the child and, soldering can be difficult and dangerous for a child. First, the person doing the soldering has to have a soldering iron. An inexperienced person can easily burn himself or herself with the soldering iron. Also, excessive heat can damage and destroy electronic components. Thus, if too much heat is applied to a component during soldering, the component can be destroyed. Further, if substitution of components is a part of the learning exercise in assembling and working with the circuit, or is part of designing and testing a new circuit, soldering the components to the printed circuit board is counterproductive in that a particular component may have to be unsoldered to disconnect it from the circuit to replace it with a substitute component.

For explanation purposes, FIG. 1 shows the back side of a prior art printed circuit board 20 having conductive traces 22 thereon. Holes 24 extend through the printed circuit board and intersect selected conductive traces 22 at desired locations for connection of leads from electronic components to be used in the circuit to be constructed. Usually traces 22 include conductive pads 26 around the holes 24. The conductive traces 22 and holes 24 are arranged to connect various electronic components in a desired manner to provide a desired electronic circuit. The individual electronic components required for the circuit are then attached to the traces, usually by inserting component leads through appropriate holes from the front side of the board, and soldering the leads to the conductive pads 26 of traces 22 surrounding respective holes 24. FIG. 2 shows the front side of the prior art printed circuit board 20 of FIG. 1. The particular printed circuit board shown is used in an educational kit for building a particular circuit, so the front side of the printed circuit board includes representations 28 of the components to be used in the circuit and instructs a user as to which components go where and which component leads are to be inserted by the user in which particular holes 24. FIG. 3 shows a component 30 mounted on the front side of the board 20 with leads 32, FIG. 4, from the component 30 inserted into and extending through appropriate receiving holes 24 through the board 20. FIG. 4 shows the backside of the board 20 with the component leads 32 of component 30 shown in FIG. 3 extending from holes 24 through conductive pads 26 of respective conductive traces 22 in position to be soldered to the respective conductive pads 26. The leads 32, FIG. 4, extending from the backside of the board 20 are soldered by the user to the conductive pads 26 surrounding the holes 24 through which the leads 32 extend to connect the component leads to appropriate respective traces 22. The ends of the leads then extending beyond the solder connection can be cut off.

Various breadboarding devices are available for use in designing electronic circuits where the leads of electronic components can be inserted into connectors on a breadboard device which provide connections to other selected components. The connectors are usually arranged in predetermined patterns so that a user can create desired connections between circuit components by selecting the particular connectors for particular components. However, such breadboarding devices generally require special knowledge of the devices and how they work and are not generally used in merely assembling a particular desired circuit in an educational kit. An educational circuit building kit usually provides a printed circuit board specifically configured for the particular circuit to be built along with the various electronic components to be assembled to the printed circuit board. There is a need for a simple and easy way of connecting and interchanging electronic components in building electronic circuits, particularly in connection with educational kits for circuits where the user does not have special electronic design knowledge, and in connection with breadboard devices where it may be desired to be able to easily connect, disconnect, and change components used in designing and constructing a circuit.

SUMMARY OF THE INVENTION

According to the invention, printed circuit boards and breadboard devices can be produced with conductive contact pads and magnetic component connectors where connection between the contact pads and the magnetic component connectors can be made by magnetic force. One of either the contact pad or the magnetic component connector will be magnetic and the other will be made of a material, such as a ferromagnetic material, to which a magnet will be attracted. For example, printed circuit boards, which usually have copper traces which do not attract a magnet, can be produced with contact pads made of a material, such as a ferromagnetic material like steel, iron, cobalt, nickel, or alloys of these materials, to which a magnet will be attracted. Circuit components are connected to magnetic component connectors having magnetic legs which then are used to connect the components to the contact pads of the circuit board or breadboard device. Alternatively, the contact pads can be magnetic with the magnetic component connectors having legs made of a material to which magnets are attracted so that, again, the magnetic component connector legs are magnetically connected to the contact pads. This makes the connection of components to a printed circuit board or breadboard device fast and easy and provides for easy removal and replacement of components. Also, magnetic component connectors can be configured to not only connect magnetically to printed circuit boards or breadboard devices, but also to one another so that components can be connected to form a circuit or part of a circuit by direct connection of magnetic component connectors.

In one embodiment of the invention, a magnetic component connector includes a plurality of electrically conductive magnetic legs joined in predetermined configuration by a nonconductive material. The leads of an electronic component to be connected to a printed circuit board or breadboard device are electrically connected to the magnetic legs of the magnetic component connector. Such connection can be in any suitable manner, such as by soldering, with clip connectors, etc. The components can be soldered on a production basis to the magnetic component connectors so that the components are supplied to the user pre-soldered to the connectors. All a user has to do to connect the component to the printed circuit board is to place the connector legs over the desired contact pads and the magnetic legs will contact and magnetically adhere to the pads and make electrical contact with the pads. If the pads are magnetic and the component connector legs are of a material which will be attracted by a magnet, similarly, all a user has to do is to place the component connector legs over the desired contact pads and the magnetic contact pads will attract and magnetically adhere the legs to the pads. Since a magnetic connection between the component connector and the contact pads is established in either situation, for purposes of the invention, the component connectors will be referred to as "magnetic component connectors" in both the situation where the legs of the connector are magnets or in the situation where the legs are not magnets but are made of material to which magnets are attracted. Where it is desired to be able to directly connect magnetic component connectors, the magnetic component connectors can be configured with short magnetic legs extending from opposite sides of the magnetic component connector so that one leg of one magnetic component connector can be connected by magnetic force directly to a magnetic leg of another magnetic component connector.

THE DRAWINGS

In the accompanying drawings, which show the best mode currently contemplated for carrying out the invention:

FIG. 8 is a perspective view of the two leg magnetic component connector of FIG. 6 with a different component connected thereto;

FIG. 9 is a perspective view of the two leg magnetic component connector of FIG. 6 with a different component connected thereto;

FIG. 10 is a perspective view of a three leg embodiment of magnetic component connector of the invention;

FIG. 17 is a vertical section through the connector of FIG. 16, taken on the line 17-17 of FIG. 16;

DETAILED DESCRIPTION OF THE ILLUSTRATED EMBODIMENTS

The current invention provides a magnetic connection of electronic components to form electronic circuits. The electronic components are mounted on magnetic component connectors and the magnetic component connectors are interconnected to interconnect the electronic components either through conductors such as provided by printed circuit boards or breadboard devices to which the magnetic component connectors are magnetically connected, or through direct magnetic connection of the magnetic component connectors. The magnetic component connectors can be easily connected to or disconnected from the conductors or from one another to assemble circuits or to change components in a circuit.

An example of an embodiment of the invention provided in the form of a kit for assembly of an electronic circuit is shown in FIGS. 5-12. The kit of FIGS. 5-12 builds the same circuit as the prior art kit of FIGS. 1-4 and shows how the invention can be applied to such a kit to eliminate the need for soldering components to the printed circuit board. Use of the magnetic attachment of components of the invention makes assembly of the components quick and easy. It also shows how the invention allows easy substitution of components. For ease of comparison, the features of the prior art printed circuit board 20 of FIGS. 1-4 that are the same in the printed circuit board 34 of FIGS. 5-12 will be referred to with the same reference numbers.

Figure 1:
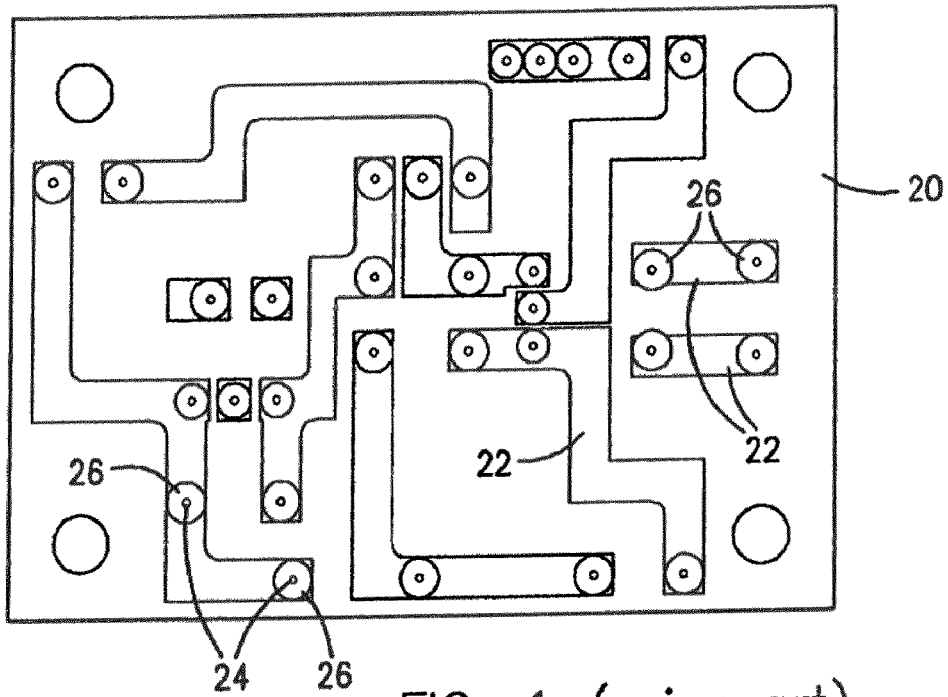
FIG. 1 is a back side view of a prior art printed circuit board showing conductive traces thereon.
Figure 2:
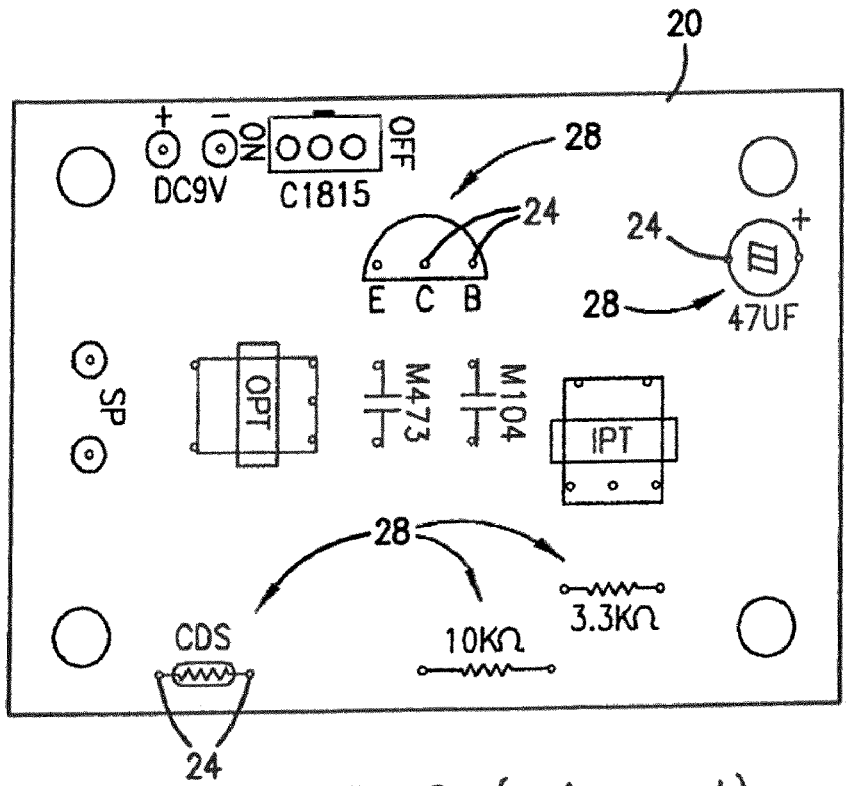
FIG. 2 is a front side view of the prior art printed circuit board of FIG. 1.
Figure 5:
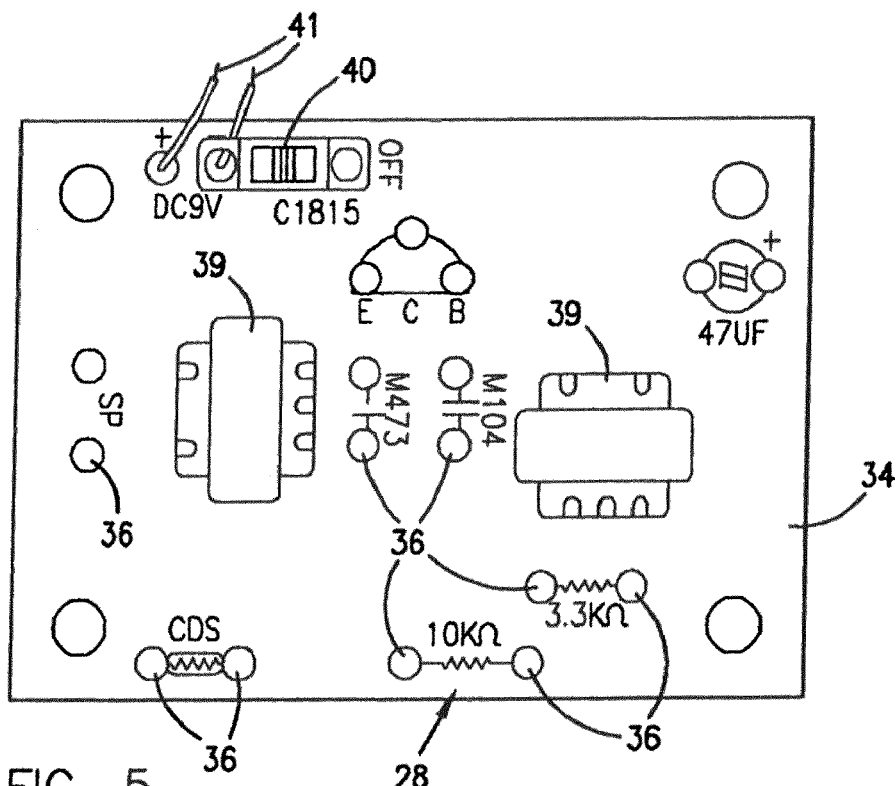
FIG. 5 is a front side view of an example of a printed circuit board of the invention.
Figure 12:
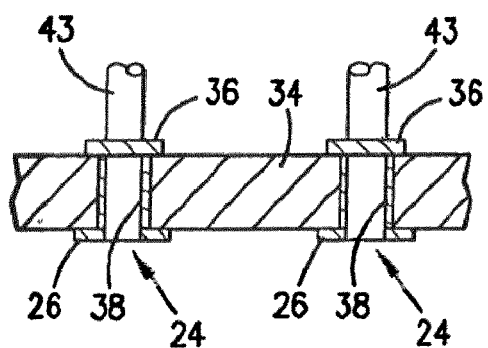
FIG. 12 is a fragmentary vertical section through a portion of the printed circuit board of FIG. 11 taken on the line 12-12 of FIG. 11, showing two of the holes through the printed circuit board with contact pads thereover, and with the legs of one of the magnetic component connectors shown in FIG. 11 secured to the contact pads.

FIG. 5 shows the front side of the printed circuit board 34 similar to printed circuit board 20 shown in FIG. 2. However, rather than holes 24 through the printed circuit board as shown in FIGS. 1 and 2 being presented to the user on the front side of the board through which the user inserts component leads to be soldered to the conductive pads 26 of the conductive traces 22 on the back side of the board, conductive contact pads 36 are presented to the user on the front side of printed circuit board 34. The conductive contact pads 36 of the invention are located approximately where holes 24 are located in printed circuit board 20 of FIG. 2 and are electrically connected to the conductive traces 22 on the back side of the board. The electrical connection between the conductive contact pads 36 shown on the front side of the board 34 and the conductive pads 26 of the conductive traces 22 on the opposite or back side of the board 34 can be made in any desired manner. For example, the inside of the holes 24 extending through the printed circuit board 20 of FIGS. 1 and 2, (circuit board 34 in FIG. 12) can be plated with a conductive material 38, as shown in FIG. 12. Conductive material 38 is in electrical contact with conductive pads 26 surrounding the holes 24 on the back side of the board and extends through the holes 24 to the front side of board 34 where it makes electrical contact with conductive contact pad 36 on the front side of board 34. Alternately, a conductor, such as a wire or a metal post, can be connected, such as by soldering, etc., to the underside of the conductive contact pad 36, pass through the hole 24 under the conductive contact pad 36, and be soldered or otherwise electrically connected to the conductive pad 26 surrounding hole 24 on the back side of board 34. In another alternate connection, solder can extend through the hole 24 and form the conductor connecting the conductive contact pad 36 with the conductive lead 22. Various other connection methods can be used. In one embodiment of the invention, the conductive contact pads 36 on the front side of the printed circuit board are formed of a material which attracts magnets, such as a ferromagnetic material.

The conductive contact pads 36 are arranged in a predetermined manner so that circuit components for the circuit to be built can be connected between selected contact pads 36. This predetermined manner will generally be standardized for particular situations. For example, there can be a predetermined standardized manner, such as a predetermined distance between two conductive contact pads 36, for components having two leads to be connected and a different predetermined manner, such as a predetermined geometric arrangement of three conductive contact pads 36 with a predetermined distance between each of the three contact pads, for components having three leads to be connected. If desired, different predetermined standardized manners can be provided for different types of components having the same number of leads. For example, different predetermined distances between conductive contact pads 36 could be provided for different types of two lead components such as one standardized distance for resistors, another standardized distance for capacitors, etc. Different standardized geometrical patterns for different types of components having three or more leads could be provided to differentiate the different types of these components.

For ease of illustration and explanation, FIG. 5 also shows transformers 39, on-off switch 40, and wires 41 from a power supply, such as a battery holder, not shown, installed in prior art manner such as by soldering, preinstalled on board 34. However, these components could be provided in magnetic component connectors of the invention to be connected to the printed circuit board in the manner of the invention as will be explained, rather than in prior art manner.

Figure 6:
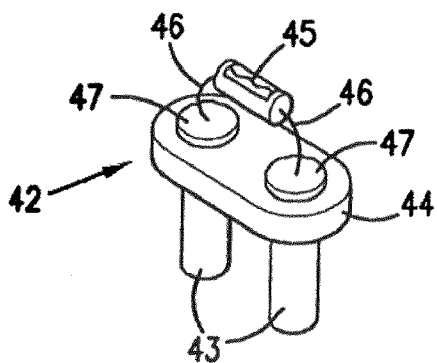
FIG. 6 is a perspective view of an example of a magnetic component connector of the invention, this example being a two leg embodiment of magnetic component connector.
Figure 7:
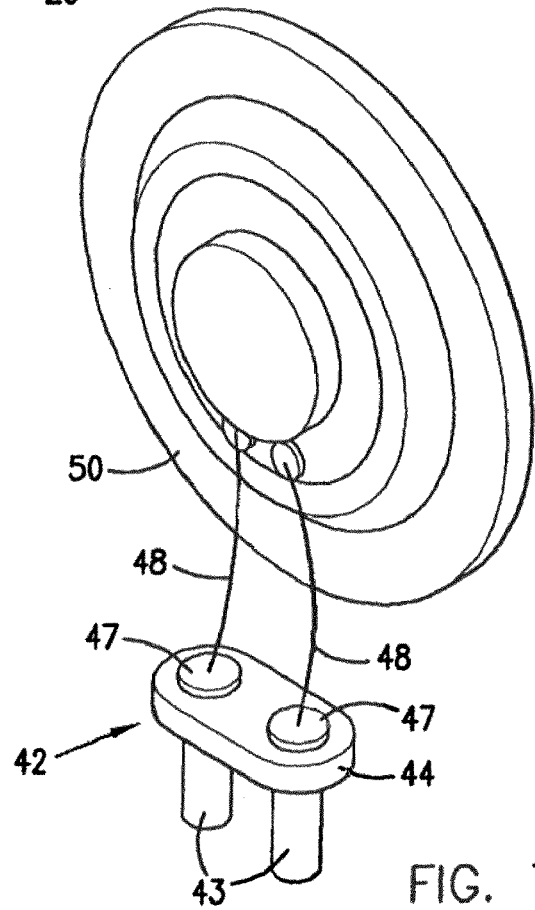
FIG. 7 is a perspective view of the two leg magnetic component connector of FIG. 6 with a different component connected thereto.

FIG. 6 shows a magnetic component connector 42 of the invention. For an embodiment of the invention where conductive contact pads 36 are formed of a material which attracts magnets, the magnetic component connector 42 has two electrically conductive magnetic legs 43 held in a predetermined orientation by a nonelectrically conductive or insulating joiner 44 connecting and positioning the magnetic legs 43. As shown in FIG. 6, an electronic component, here a light sensor 45, has two leads 46 with one lead 46 electrically connected to the head or top 47 of one of the magnetic legs 43 and the other lead 46 connected to the head or top 47 of the other of the magnetic legs 43. The connection of the leads 46 to the tops 47 of the magnetic legs 43 may be made in any desired manner, such as by soldering. Alternately, the tops 47 of the magnetic legs 43 could be provided with a terminal, such as a screw or clip terminal, or with an electrically conductive clip of various types to which the component leads can be connected. FIG. 7 shows a similar two leg magnetic component connector 42 with leads 48 connecting a speaker 50 to the tops 47 of the respective magnetic legs 43. FIG. 8 shows a similar two leg magnetic connector 42 with leads 52 from a resistor 54 connected to the tops of respective legs 43. FIG. 9 shows a similar two leg magnetic connector with leads 56 from a capacitor 58 connected to respective legs 43. It should be noted that the magnetic component connector 42, rather than having an actual electronic component connected between the legs, can also merely have a conductor, such as a wire, connected between the legs to form a jumper. For purposes of this disclosure, a wire or other conductor will be considered as an electronic component and the jumper as a magnetic component connector.

If desired, a cover or magnetic component connector case top 60, FIG. 8, can be provided to be attached to joiner 44 over the electronic component and lead connections to the legs. This will provide protection for the component and for a user. Joiner 44 will form a connector case bottom with legs 43 extending therefrom. The cover 60 and joiner 44 can be configured so that cover 60 snaps onto joiner 44, removably if desired, or cover 60 can be glued or otherwise secured to joiner 44 to form a case encasing the electronic component. Depending upon the component enclosed by the cover, the cover can be transparent or can have a transparent window provided in the top of the cover to either display the component to the user or expose the component to the environment surrounding the case. For example, with a light sensor as shown in FIG. 6, a transparent cover or transparent window would allow the light sensor to sense the ambient light around the magnetic component connector. A light sensor would not work as usually desired if it was enclosed in an opaque cover as no ambient light could reach the sensor. Also, the cover can be labeled with identification information 61 identifying the electronic component within the cover. For example, if the electronic component is a resistor, the top or side of the cover can be marked with a resistor symbol and the value of the resistance. A capacitor can be similarly labeled with the capacitor symbol and capacitance value. A transistor, in a three leg connector, can be labeled with the transistor symbol and the transistor number. Various types of markings can be used.

FIG. 10 shows a three leg magnetic component connector 62 with leads 63 connecting a transistor 64 to three respective leg tops 65 of three magnetic legs 66 (only two magnetic legs being visible). The legs 66 are held in position by joiner 67. If, as shown, the three leg arrangement has three legs equally spaced, the connector will be marked in some way, such as by marking one of the legs or by marking the top or sides of a case cover over the transistor, to identify which legs correspond to the base, emitter, and/or collector of the transistor. If the leg arrangement is distinctive, such distinctive arrangement will generally be standardized for the three transistor leads so that the transistor base, collector, and emitter will always be connected to the same legs of the distinctive three leg connector.

The predetermined orientation of the legs 43 of the magnetic component connectors 42 are coordinated with the predetermined manner of arrangement of the conductive contact pads 36 of magnet attracting material on the printed circuit board. Thus, if the contact pads 36 on the printed circuit board are arranged with a predetermined distance between the pads for components having two leads, the magnetic component connectors 42 for use with components having two leads have a leg orientation such that the connector has two legs 43 with the legs spaced apart the same distance as the distance between the two circuit board contact pads 36 to which the component is to be connected. A magnetic component connector with the desired component secured thereto can then be easily connected to the two contact pads of the printed circuit board for that component to connect the desired component between the two desired circuit board contact pads. If a different predetermined manner of arrangement, such as a different distance between printed circuit board contact pads, is provided for different types of components, such as one distance for a resistor and a different distance for a capacitor, different magnetic component connectors will be provided with different predetermined leg orientations (distances between the legs) matching the different contact pad distances for the resistors and for the capacitors. A three lead magnetic component connector will have a leg orientation of three legs to match the three contact pad arrangement of the three contact pads for connection of such a three lead component to the printed circuit board. In this way, the components needed for the circuit can be easily attached to the printed circuit board to create the desired circuit. Also, depending upon the different pad arrangements and the different connector leg orientations, a user can be guided to different degrees in connecting the proper components to the proper pads. Users can also determine the placement of magnetic component connectors with respect to the printed circuit board by matching component identification indicia, see 61, FIG. 8, on the magnetic component connector with component identification indicia, see 28, FIGS. 5 and 10, on the printed circuit board.

Figure 3:
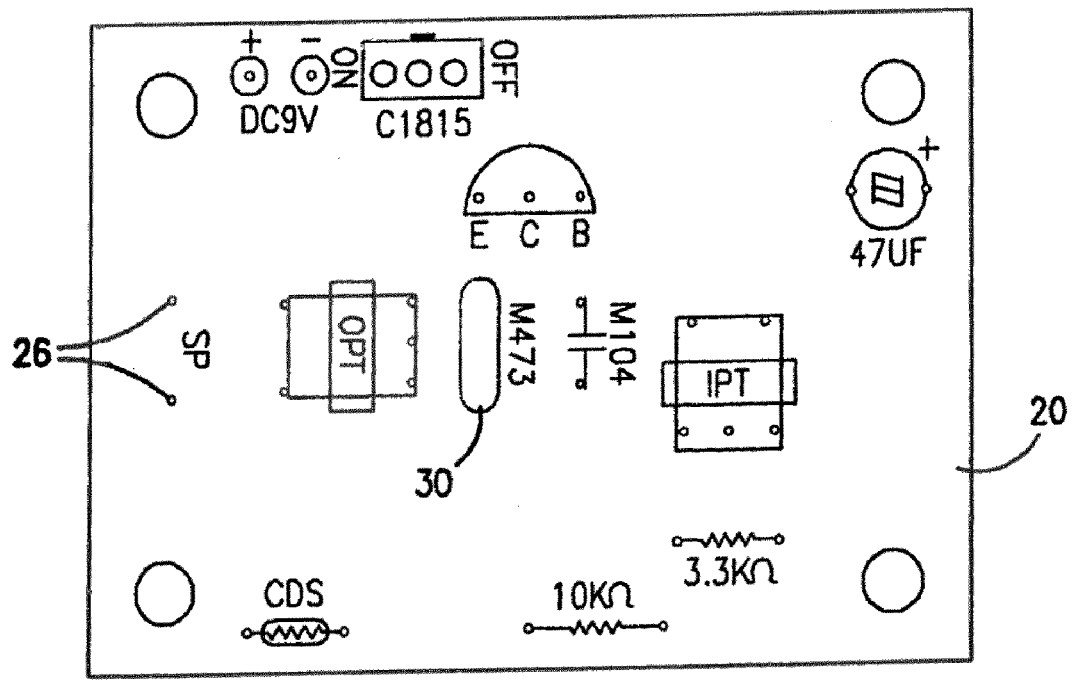
FIG. 3 is a front side view of the prior art printed circuit board similar to that of FIG. 2, but showing an electronic component in place on the board.
Figure 11:
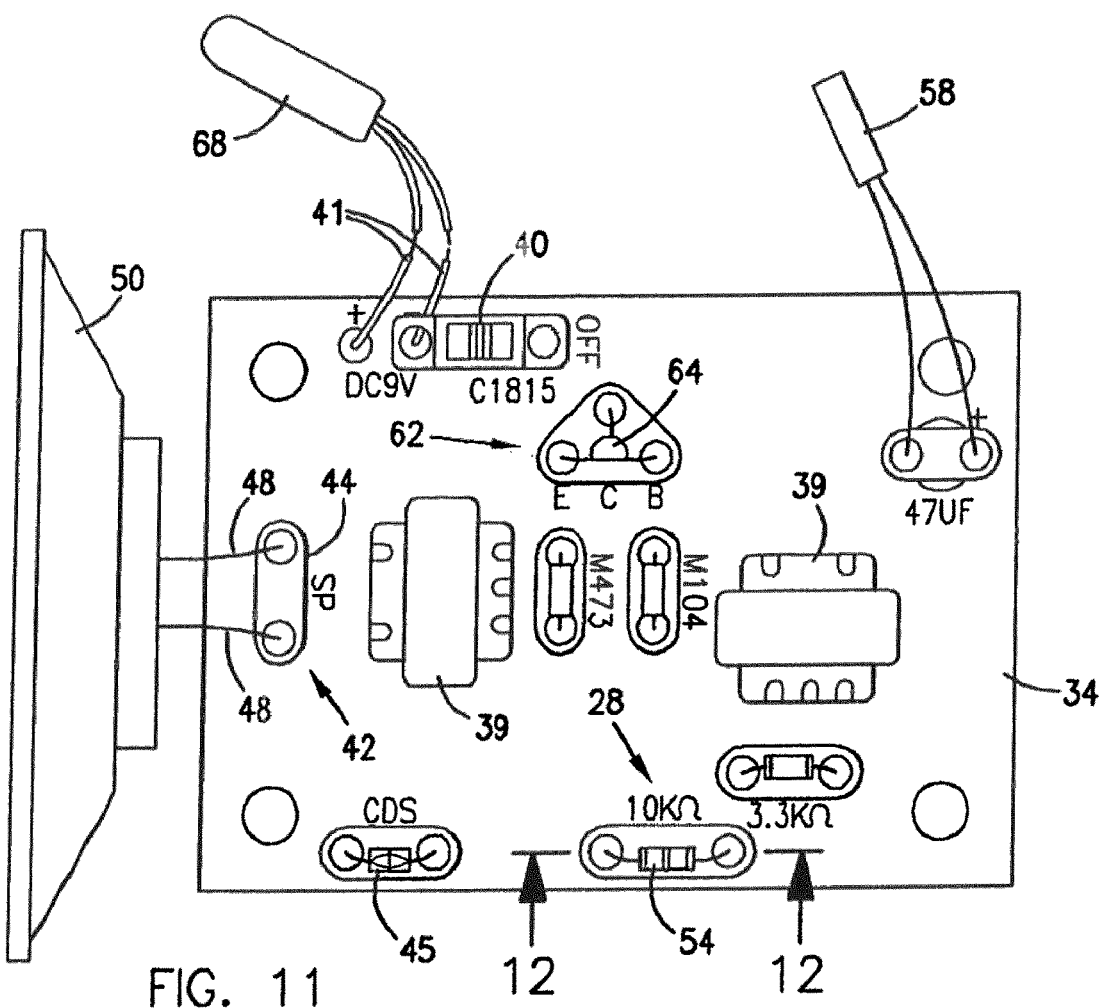
FIG. 11 is a front side view of the printed circuit board of FIG. 5 showing the magnetic component connectors of FIGS. 6-10 connected thereto.

The magnetic component connectors make connection of the components to the printed circuit board easy. FIG. 11 shows the assembled circuit using the printed circuit board 34 of FIG. 5 with all components that are mounted on magnetic component connectors installed. To install a component, the user merely selects a component that has been connected to a magnetic component connector, such as the magnetic component connector attached to the speaker 50 as shown in FIG. 7, locates the position where the speaker should be connected to the printed circuit board, here to the conductive contact pads 36 along the left side of the printed circuit board 34 in FIG. 11 (as shown in FIGS. 3 and 5, the indication SP is positioned between the holes 24, FIG. 3, and contact pads 36, FIG. 5, along the left side of the printed circuit board), and positions the connector over the appropriate conductive pads 36 and moves the magnetic legs 43 of the magnetic component connector 42 toward the conductive pads 36. The magnetic legs 43 will be attracted to the conductive contact pads 36 and connect to the conductive contact pads 36 through magnetic forces and be connected in the position as shown in FIG. 11. The remaining two leg magnetic component connectors with components as shown in FIGS. 6-9 are similarly installed on printed circuit board 34 and are shown installed on the circuit board in FIG. 11. The three leg magnetic component connector 62 of FIG. 10, is similarly positioned with respect to the three contact pads 36 labeled E C B in FIG. 5, to connect transistor 64 to the circuit board as shown in FIG. 11. While other components such as transformers 39, on-off switch 40, and wires 41 connected to battery connector or holder 68 are shown installed on circuit board 34 in FIG. 11 in traditional manner, this is shown this way merely for purposes of illustration of the invention. The invention contemplates that most, if not all, of the circuit components will be installed using magnetic component connectors of the invention. Thus, the transformers, on-off switch, and battery holder could also be mounted on magnetic component connectors for magnetic connection to the circuit board 34 by the user.

If a component needs to be removed, the magnetic component connector with that component is easily pulled from the conductive pads 36. When removed, the component can easily be rearranged or replaced with an alternate component by rearrangement of the magnetic component connector or by substitution of another magnetic component connector carrying the alternate component.

Figure 13:
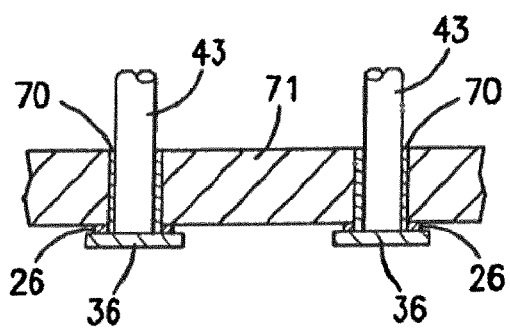
FIG. 13 is a fragmentary vertical section similar to that of FIG. 12 showing a different embodiment of the printed circuit board and magnetic component connector attachment.

While the conductive pads 36 of the printed circuit boards of the invention can be arranged on the front side of the printed circuit board as shown in FIGS. 5 and 11, the pads can alternately be placed on the backside of the printed circuit board. The magnetic component connectors can be attached to the pads on the backside in the same manner as shown for the pads on the front side of the printed circuit board, or the holes 24 through the printed circuit board can be enlarged to a size to allow the magnetic legs 43 of the magnetic component connectors to pass therethrough. These enlarged holes are shown in FIG. 13 as holes 70 through printed circuit board 71. In such case, the contact pads 36, secured to conductive pads 26 of conductive traces 22 on the backside of the printed circuit board can be arranged to cover and form ends of the enlarged holes 70 and the magnetic legs 43 of the magnetic component connectors can be connected from the front side of the board as shown in FIG. 11, but with the connector magnetic legs 43 passing through the holes 70 in the board and attaching to the pads 36 at the ends of the holes adjacent the back side of the board 71.

Figure 14:
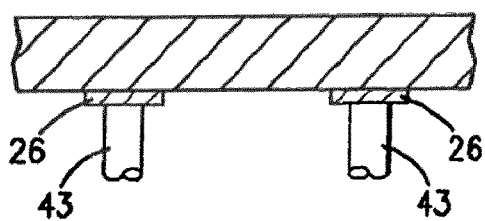
FIG. 14 is a fragmentary vertical section similar to that of FIG. 12 showing a different embodiment of the printed circuit board and magnetic component connector attachment.

Further, while separate conductive contact pads 36 of material which attracts magnets are shown in FIG. 13 attached to the printed circuit board and electrically connected to printed circuit board conductive pads 26, the conductive pads 26 themselves, FIG. 14, may be formed of material which attracts magnets and may be arranged on a printed circuit board 72 to have exposed portions thereof or enlarged pad portions thereof with the predetermine manner of arrangement so that magnetic legs 43 of magnetic component connectors can be attracted to and magnetically attached directly to the conductive pads 26, or to other magnet attracting portions of conductive traces 22 without the provision of the additional conductive contact pads 36.

Figure 15:
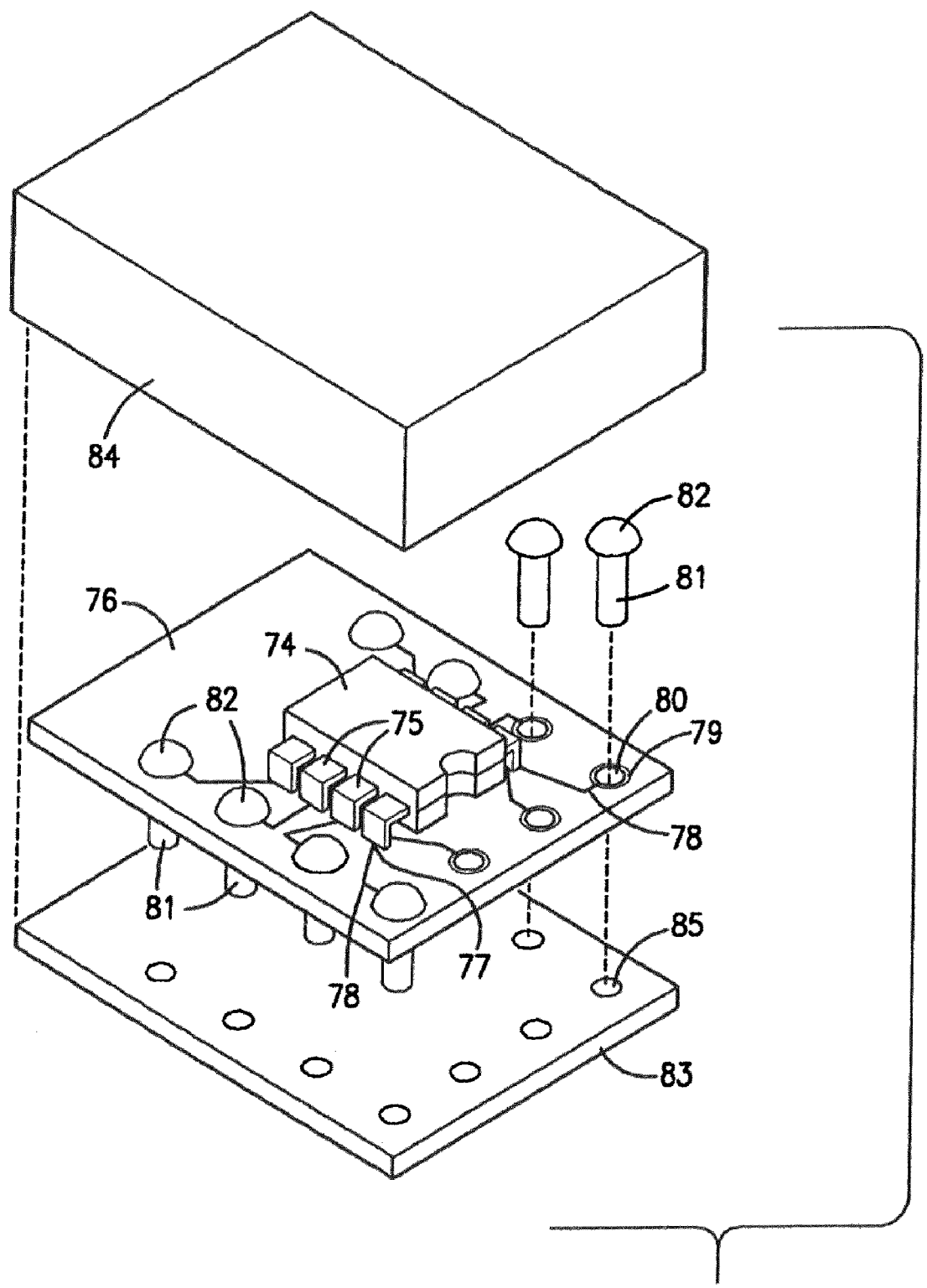
FIG. 15 is an exploded view of a magnetic component connector for an integrated circuit.

Magnetic component connectors have so far been shown for two and three lead electronic components. Similar magnetic component connectors can be provided for other types of electronic components such as integrated circuits which may have many leads extending therefrom. FIG. 15 shows an eight lead integrated circuit magnetic component connector of the invention. Eight lead integrated circuit 74 with leads 75 is mounted on a printed circuit board 76. The leads 75 are electrically connected to terminal pads 77 with traces 78 leading to conductive pads 79 around holes 80. Magnetic legs 81 are inserted through and secured in holes 80, with leg heads 82 in electrical contact with conductive pads 79. For example, legs 81 may be sized to have a friction fit in printed circuit board receiving holes 80 so that when inserted through holes 80 with the leg heads 82 against conductive pads 79 the legs are securely held by friction in the holes. The leg heads 82 can be soldered or glued with electrically conductive glue to conductive pads 79 to ensure good electrical contact and to further secure the legs 81 to the printed circuit board 76. Various other ways of mounting legs 81 to printed circuit board 76 can be used. With an eight lead integrated circuit, at least eight magnetic legs 81 will generally be provided to provide a magnetic leg 81 for each component lead 75. The printed circuit board 76 with integrated circuit 74 thereon and legs 81 extending therefrom can be used in that form as an eight leg magnetic electronic component connector to be connected to up to eight conductive pads provided on a printed circuit board similarly to the connections described for two and three leg connectors. If desired, the printed circuit board 76 can be mounted in a case with a case bottom 83 and case cover 84. Magnetic legs 81 extend through holes 85 in case bottom 83 This then provides eight magnetic legs extending from the bottom of the case. The case can be labeled, such as on the top of the case, to indicate the particular integrated circuit encased therein. Similar magnetic connectors can be provided for integrated circuits having different numbers of leads.

Figure 16:
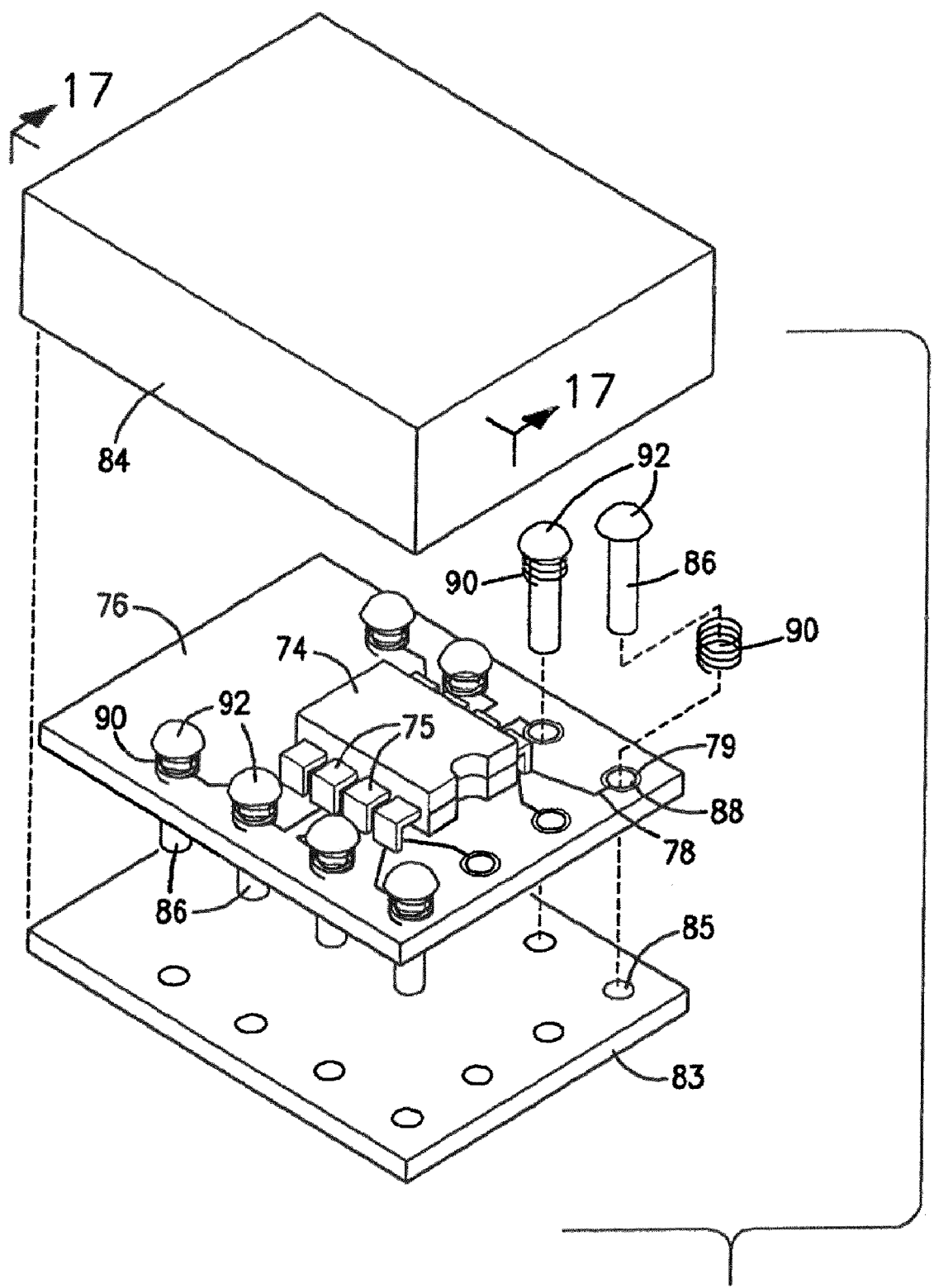
FIG. 16 is an exploded view of a magnetic component connector similar to that of FIG. 15 but showing the magnetic legs mounted differently.

The embodiment of FIG. 15 shows all eight legs of the connector rigidly mounted and extending from printed circuit board 74, and, if present, from the connector case bottom 82. In such case, it is important that all legs extend exactly the same distance so all legs will contact a flat surface and it is important that the conductive pads to which the legs are to be connected all form a flat surface, i.e., are all arranged in the same level plane, so that all legs will make good contact with all conductive pads to which the respective legs are to be connected. If one or more leg is short or one or more leg is long, or if the pads are not arranged in a level plane, all of the legs will not make contact with the pads to which they are to be connected and the circuit to be constructed will not operate. This potential problem of all legs not making good contact generally applies to magnetic component connectors having four or more legs. Connectors with three or less legs generally will not have this problem as the three legs will always be able to contact three pads. In order to ensure that all legs will make good electrical connection with respective intended pads, the legs may be spring loaded so can adjust to uneven conductive pads or compensate for differences in leg extension lengths from the connector. Referring to FIG. 16, a magnetic component connector similar to that of FIG. 15 shows the eight lead integrated circuit 74 with leads 75 mounted to printed circuit board 76 as in FIG. 15, however, the magnetic legs 81 in FIG. 15 are replaced by spring loaded magnetic legs 86 so that they will adjust to any imperfections in leg mounting length or unevenness in pad positioning.

Magnetic legs 86 are sized to freely move in receiving holes 88 in printed circuit board 76. Springs 90 are positioned between leg heads 92 and conductive pads 79 to bias magnetic legs 86 in the direction of the front side of the board. Springs 90 can be conductively connected to conductive pads 79, such as by soldering or gluing and similarly conductively connected to leg heads 92. With this arrangement, it is advantageous to use a connector cover such as provided by case bottom 83 and case cover 84 to protect the spring mounted legs 86. When the cover is used, it is not necessary to connect the spring to either the conductive pads 79 or the magnetic leg head 92 as the spring pressure will usually make a satisfactory connection. Further, the connector case cover 84 will limit the travel of the magnetic leg in the biased direction into the case and toward the case cover 84. Padding or spacing material can be provided inside the cover to form a stop for the legs against the bias if desired and as necessary to provide the desired amount of leg travel under bias of the spring 90 into the case. While various bias arrangements can be used, with the arrangement shown, the legs are biased by springs 90 into the case. When the case is placed over the conductive contact pads to which the legs are to connect, the legs will be magnetically attracted to the contact pads to which they are to be connected, and as the connector approaches the contact pads, the legs 86 will be drawn outwardly from the bottom of the case against the bias of the springs 90 to attach to the contact pads. As the case is released to connection with the contact pads, the springs will again retract into the case to the extent permitted by the arrangement of the contact pads and lengths of the legs so that all legs maintain good magnetic contact and connection with the pads. If the pads are uneven or the leg length is uneven, the retraction of the legs into the case will equalize with some legs extending farther from the case than others so that good connection is made between all legs and all contact pads as shown by FIG. 17. Thus, as shown by FIG. 17, contact pads 94 are not all arranged in the same flat plane. Some of the contact pads 94 are higher than other contact pads. The legs 86 that are connected to the lower contact pads extend further from the connector by compressing springs 90 to a greater extent than the legs that do not extend as far. The legs 86 that extend further from the connector have more space between the top or heads of the leg and the inside of the top cover 84 than do the legs that do not extend as far.

Figure 24:
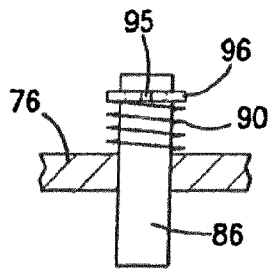
FIG. 24 is a side elevation of an alternate embodiment of magnetic leg mounting.
Figure 25:
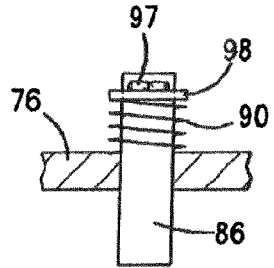
FIG. 25 is a side elevation of a further alternate embodiment of magnetic leg mounting.
Figure 26:
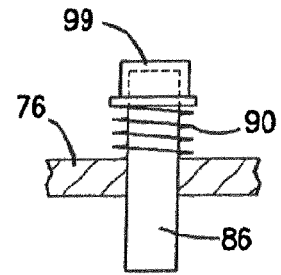
FIG. 26 is a side elevation of a still further alternate embodiment of magnetic leg mounting.

While the legs in FIGS. 15, 16 and 17 are shown with heads to hold the springs, the legs can be straight with no head and with various other arrangements to hold the springs. For example, as shown in FIG. 24, a leg 86 could have a groove 95 therein near one end to receive a C-retaining ring 96 to form an enlarged flange on the leg 86 to hold the spring 90 similarly to the heads 92. As shown in FIG. 25, a leg 86 could have a hole therethrough to receive a pin 97, such as a cotter pin, to hold a washer 98 to form an enlarged flange on the leg to hold spring 90. As shown in FIG. 26, a leg 86 could have a cap 99, such as a plastic cap, frictionally held on the end of the leg 86 or glued to the end of the leg 86 to form an enlarged flange for holding the spring 90. Alternately, various other spring retaining structures could be used. Further, the springs could be placed to bias the legs outwardly with the uneven pads or shorter legs causing all of the legs to move inwardly rather than outwardly to equalize the leg positioning.

Figure 18:
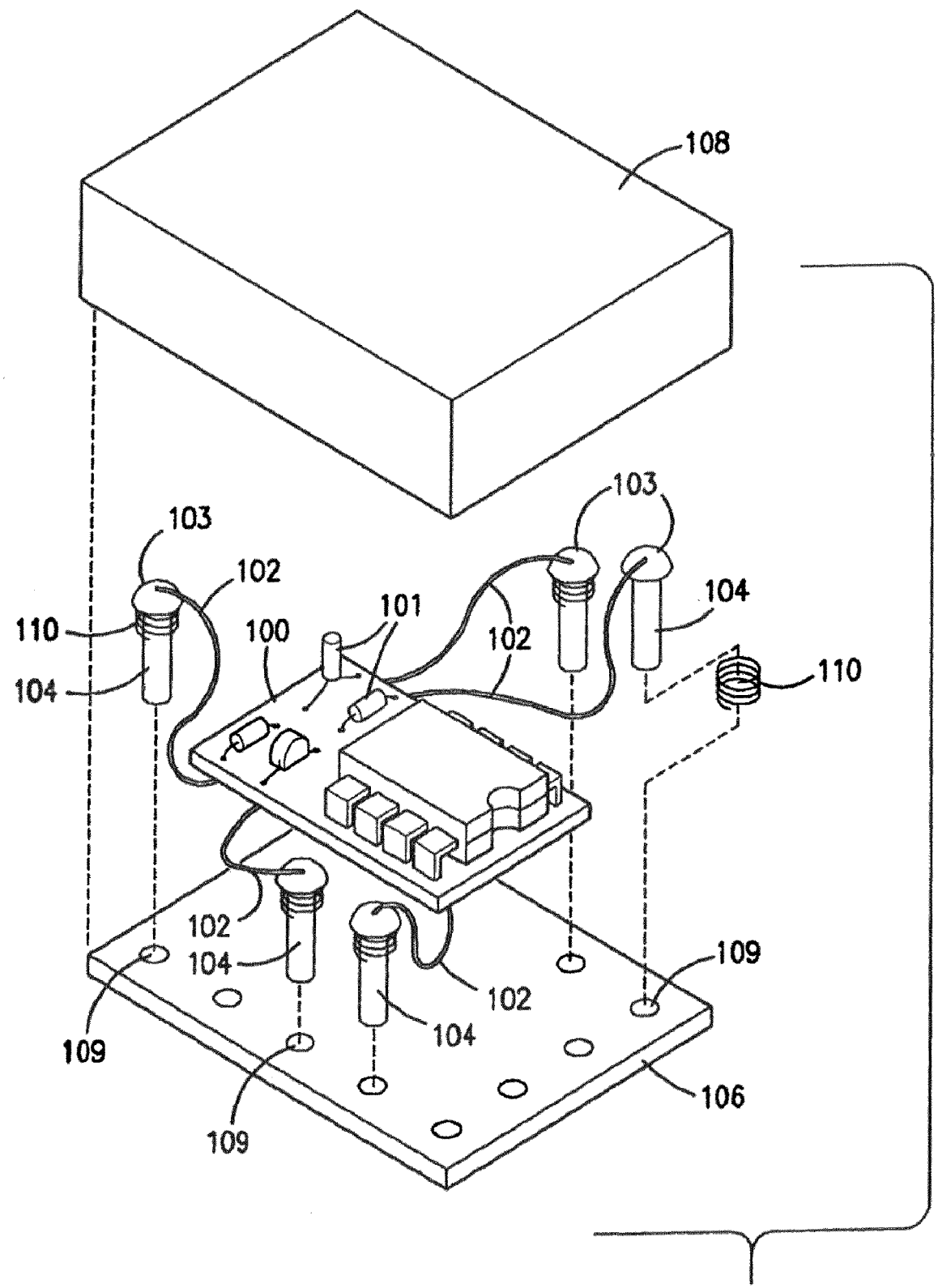
FIG. 18 is an exploded view of a magnetic component connector for a preassembled sub-circuit for use in a larger circuit to be assembled.

So far the magnetic component connector has shown individual electronic components, such as resistors, capacitors, transistor, integrated circuits, etc. mounted in the magnetic component connectors to be then easily connected to a printed circuit board or a breadboard device. However, various preassembled sub-circuits can also be mounted in the magnetic component connectors and easily magnetically connected by a user, in the manner described, to a larger circuit. FIG. 18 shows a printed circuit board 100 with various components 101 which can include integrated circuits, resistors, capacitors, transistors, etc., mounted thereon and interconnected in normal manner by traces on the back side of the printed circuit board (not shown), to form a circuit which can be connected as a sub-circuit in a larger circuit. Circuit board 100 has wires 102 extending therefrom connected to various input and output points on the back side of the circuit board, not shown, with the wires 102 connected to the heads 103 of magnetic legs 104 of a magnetic component connector. In the embodiment of the connector shown in FIG. 18, the legs are spring mounted to a base 106 which serves as a magnetic component connector case bottom. A case cover 108 is secured to the base 106 to cover the circuit mounted therein. The legs 104 pass through holes 109 in base 106 and are spring mounted similarly to the legs of FIGS. 16 and 17, by springs 110, but are mounted directly to the cover bottom or base 106, rather than to the printed circuit board 100. The magnetic legs can be similarly mounted directly to the base or bottom of the case when mounting just an integrated circuit as in FIGS. 15-17, or the printed circuit board forming the sub-circuit of FIG. 18 can have the legs mounted to the printed circuit board similarly to the embodiment of FIGS. 16 and 17 or in fixed position as shown in FIG. 15. Legs can also be mounted directly to the base in rigid manner as in FIG. 15, rather than being spring mounted.

In addition, while the legs in FIGS. 16 and 17 are shown as spring loaded or biased, it is not necessary that the legs be biased to provide good contacts. The legs can merely be loosely received through the mounting holes so that they can move up and down through the holes. The magnetic force between the legs and the contact pads will cause each leg to make good contact with the pad and will appropriately position the legs in the component connector. This will work well when wires connecting the components are connected directly to the legs, as shown in FIG. 18.

Figure 19:
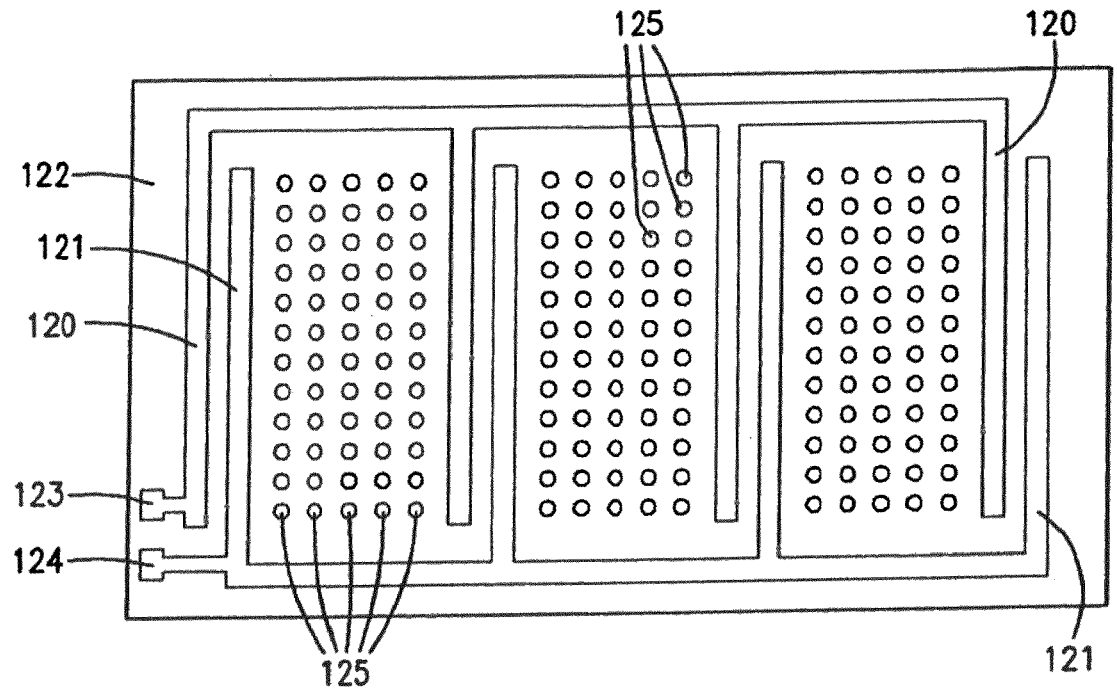
FIG. 19 is a fragmentary top plan view of a breadboard device of the invention.
Figure 20:
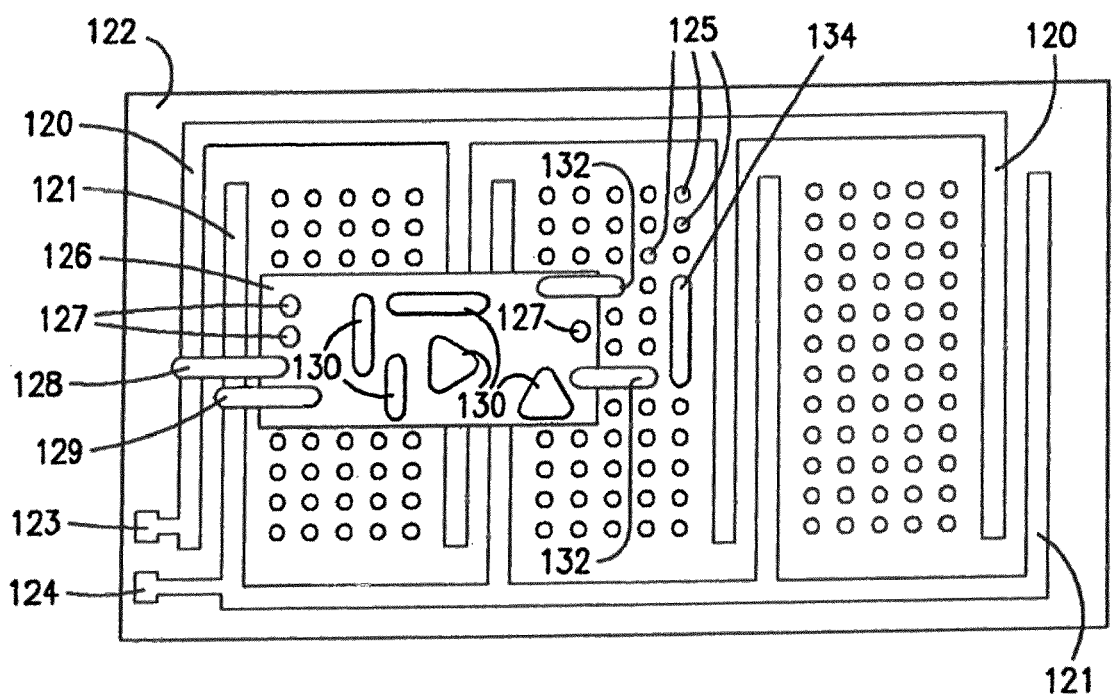
FIG. 20 is a fragmentary top plan view of the breadboard device of FIG. 19 showing a printed circuit board mounted thereon of showing magnetic component connectors of the invention mounted to both the breadboard device on the printed circuit board.

FIG. 19 shows a breadboard arrangement for circuit building. With this breadboard arrangement, metal conductive power traces 120 and 121 are shown on the surface of breadboard 122. Power traces 120 and 121 can supply opposite AC polarity power or can supply positive and negative polarity DC power. One of the traces will usually be considered electrical ground for the circuit. Appropriate power for the circuit to be constructed on the breadboard is supplied to the power traces through power contact pads 123 and 124. In the usual breadboard arrangement, the power traces 120 and 121 extend in spaced pairs up and down lengthwise (vertically as shown in FIGS. 19 and 20) on the breadboard, while rows of contacts 125 are provided extending widthwise (horizontally as shown in FIGS. 19 and 20) between the spaced pairs of power traces. The respective rows of contacts 125 are spaced vertically form one another. Each row of contacts 125 between a pair of power traces are electrically connected together, but the respective rows are electrically isolated from one another. In traditional breadboard arrangements, an insulating cover provides the surface of the breadboard and contacts 125 are holes or openings in which to insert the ends of electronic component leads which are to be connected, and holes are also provided along the power traces into which component leads to be connected to the source of power are inserted. PCT Application No. PCT/KR2006/003696 shows a breadboard arrangement similar to that shown in FIGS. 19 and 20 in which electronic components to be used in constructing circuits on the breadboard are supplied in magnetic component connectors similar to those described herein, and in which the components are magnetically connected to the breadboard contacts rather than inserted into or otherwise connected to the contacts as in traditional breadboards. In the breadboard arrangement of the cited PCT Application, contacts 125 are provided as holes in the insulating cover, and holes are provided along the power traces through which magnetic component connector legs are inserted to be magnetically connected to the contacts or traces.

In the present invention, however, power traces 120 and 121 can be mounted on the surface of the bread board as can contacts 125. The power traces 120 and 121 and contacts 125 are formed of a material to which magnets are attracted. One or more test printed circuit boards 126 with conductive contact pads 127 as previously described, can be mounted on breadboard 122, such as by magnetic connectors which could connect to certain contacts 125 under the board, or by pegs that could be inserted into receiving holes provided in the breadboard, not shown. As shown in FIG. 20, test printed circuit board 126 is provided with a plurality of conductive contact pads 127 similar to the conductive contact pads previously described. A magnetic component connector 128, here forming a jumper, connects power trace 120 on breadboard 122 to an appropriate conductive contact pad 127 on test printed circuit board 126 (conductive contact pads 127 are not visible under the magnetic component connectors). A similar jumper 129 connects an appropriate conductive pad 127 of the printed circuit board to the other power trace 121. Various magnetic component connectors 130 connect components between desired conductive pads 127 of printed circuit board 126. Further, various magnetic component connectors 132 can connect appropriate selected conductive contact pads 127 of the printed circuit board 126 to contacts 125 of the breadboard 122, while additional magnetic component connectors 134 can be used to interconnect rows of isolated contacts 125. In this way, various circuits can be easily designed and tested. Printed circuit board 126 can be configured to form a particular circuit when appropriate components are connected which can then become a sub-circuit of a larger circuit to be constructed on the breadboard, or printed circuit board 126 can be configured as a separate and independent breadboard where various circuits can be formed by connection of desired components between appropriate conductive contact pads 127 forming interconnection sites in a manner similar to a standard breadboard.

Figure 4:
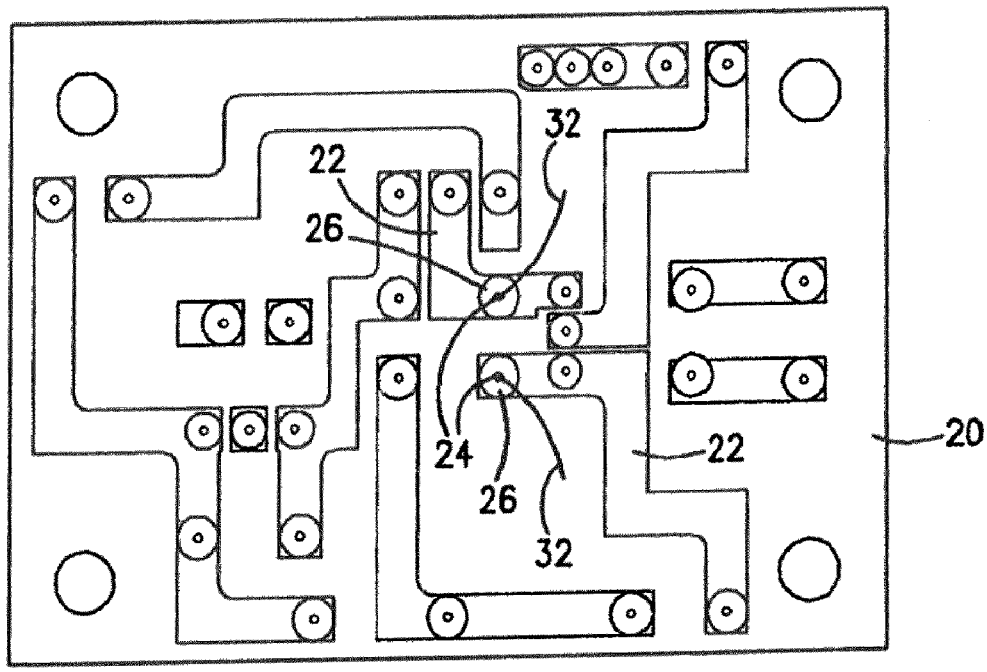
FIG. 4 is a back side view of the prior art printed circuit board similar to that of FIG. 1, but showing the component leads of the component shown in FIG. 3 extending from the holes in the board.
Figure 27:
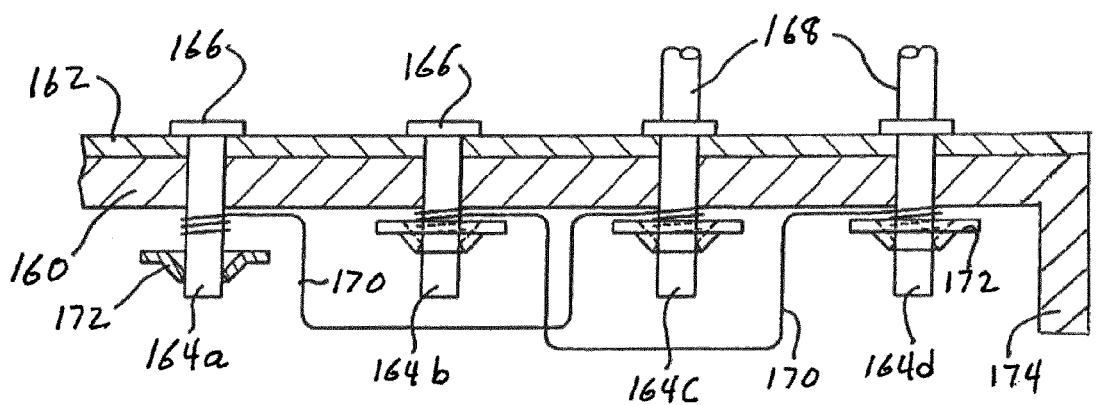
FIG. 27 is a side elevation of a further embodiment of a printed circuit board of the invention.

FIG. 27 shows a further embodiment of printed circuit board according to the invention which is really a substitute for a printed circuit board, but, for purposes of the invention, will be considered a printed circuit board. The board of FIG. 27 includes a piece of cardboard or other material forming the base 160 for the circuit. The base can have a representation of the circuit to be built printed thereon, which can include color representations of the magnetic component connectors used in the circuit. A plastic overlay 162 can be placed on or laminated to the top of base 160 to protect it. Pins 164a, 164b, 164c, and 164d, with heads 166 extend through the base 160, with heads 166 forming the conductive contact pads for magnetic attachment of the legs 168 of a magnetic component connector. Rather than conductive traces 22 being adhered to the backside of the board as in the conventional printed circuit board as shown in FIGS. 1 and 4, wires 170 connect respective pins 164a, 164b, 164c, and 164d to be connected. The wires can be connected to the respective pins in various ways. In the embodiment shown in FIG. 27, wires 170 are wrapped around the pins to which they are to be connected. As shown, a wire 170 is wrapped around pin 164a and extends to and is wrapped around pin 164c to electrically connect pins 164a and 164c. Another wire 170 is wrapped around pin 164b and extends to and is wrapped around pin 164d to electrically connect pins 164c and 164d. Any number of pins can be provided to extend through base 160 and to be interconnected by wires 170 in any desired circuit configuration, the wires taking the place of the normal conductive traces on a printed circuit board. While the wires 170 are shown spaced from the bottom surface of board 160, this is for illustration purposes as such wire will normally extend substantially along the bottom surface of board 160. A plastic lock washer 172 is slid onto each pin 164a, 164b, 164c, 164d, and all other pins provided through the base 160 to secure the pins in place and protect the wires 170 where wrapped around the respective pin. Again, while shown spaced from the bottom of board 160, this is for illustration purposes and the lock washers 172 are normally positioned tightly against the bottom of board 160. If desired, to hold the pins in place during wire connection, a locking washer can be placed on the respective pins prior to connection of the wires to hold the pins in place with respect to the base, with a second locking washer placed on the pins after connection of the connecting wires 170 to protect the wrapping or other connection of the wires. The board of FIG. 27 can be used for producing low cost educational electronic circuit kits since the cardboard is less expensive than printed circuit board material, and nice looking representations in color of the circuit to be built can easily be printed on the cardboard.

As can be seen from FIG. 27, pins 164 extend below the bottom of board 160 through which they extend. This can be a potential problem if the circuit board is placed on an electrically conductive surface, such as a metal tray, because the electrically conductive surface can short out pins 160. Thus, it is generally good practice to provide a rim or edge 174 around board 160, or other support such as legs, to support board 160 and the ends of pins 164 above a supporting surface to prevent accidental shorting between pins. When board 160 is made of cardboard, the rim 174 can also be cardboard and constructed in the form of a portion of a cardboard box, such as a top for a cardboard box, with rim 174 extending around the perimeter of board 160 to support it.

While it is currently preferred for good electrical contact between each leg of the magnetic component connector with the circuit board contact pads that each leg be magnetic to be attracted to the contact pad with which it is to be electrically connected, less than all legs of a magnetic component connector can be magnetic with those nonmagnetic legs held in contact with the conductive pad by the force applied to the connector by the legs that are magnetic. Thus, with a three leg connector, it is possible to make two of the legs magnetic, with one leg nonmagnetic, but held in conductive attachment with a conductive pad when the connector is attached to a circuit board by the force of the two magnetic legs.

According to the invention, a circuit board of the invention designed to make a particular circuit can be supplied as part of a kit along with a plurality of magnetic component connectors having the required electronic components for the particular circuit pre-connected to the magnetic component connectors so that a user of the kit has everything necessary for building the circuit and can easily connect the required components to the circuit board to make the particular circuit. In addition or alternately, magnetic component connectors with particular electronic components pre-connected thereto can be separately individually made available to users so that a user can separately acquire different components for building or modifying a circuit. Further and/or alternately, magnetic component connectors can be provided without electronic components pre-connected thereto so that a user can acquire desired components for a circuit and connect such components to the magnetic component connectors and then connect such components to a circuit using the magnetic component connector. Rather than the printed circuit board being configured to form a particular circuit, the printed circuit board can be configured to alternately form several different circuits depending upon which magnetic component connectors with which specific components are selectively connected between which conductive contact pads. Further, the printed circuit board can be configured similarly to a breadboard so that a user can attach desired components between desired interconnection conductive contact pads as a user would with a conventional breadboard. Thus, the printed circuit board would be configured with power connection conductive pads and with a plurality of interconnection conductive contact pads.

While the magnetic component connectors have been described with magnetic legs which are attracted to the conductive contact pads made of a material to which magnets are attracted, the invention can be similarly implemented by making the conductive pads of magnets and making the legs of the magnetic component connectors of the material that attracts magnets. In this way, the legs are still attracted to and attached to the conductive pads by magnetic force. Thus, the conductive pads 36 in FIG. 5 could each be magnets. In such case, legs 43 of the magnetic component connectors would be made of material to which magnets are attracted, rather than being magnets, so would be attracted to and would attach to pads 36 by magnetic force.

Similarly, referring to FIGS. 3 and 4 of the cited PCT Application No. PCT/KR2006/003696, base 107 as shown in those drawings made of a material to which magnets are attracted could be a magnet, for example, made of the same magnet material as flat refrigerator magnets, and the legs 126 of the magnetic component connectors shown in PCT drawings FIGS. 6-8 and 11 would then be made of material attracted by magnets, rather than being magnets, to provide the attraction and attachment of the legs 126 to the selected pads 101, 102, and 105 by magnetic force.

Figure 21:
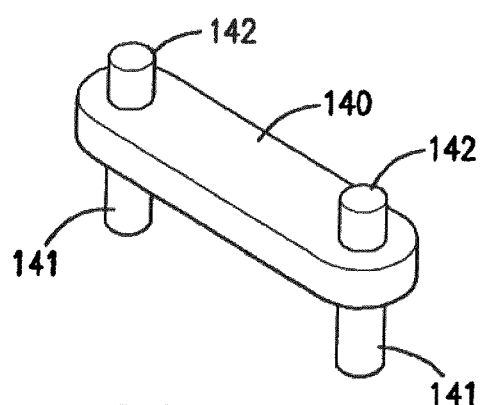
FIG. 21 is a perspective view of another embodiment of magnetic component connector of the invention.
Figure 22:
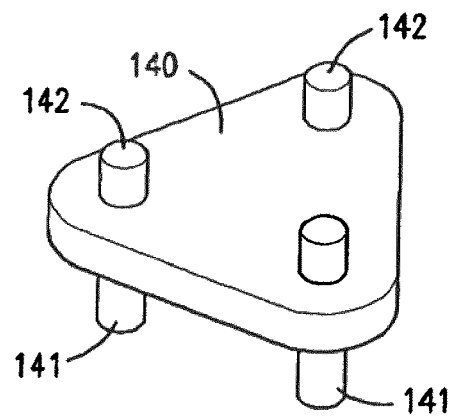
FIG. 22 is a perspective view of another magnetic component connector of the invention similar to that of FIG. 21.
Figure 23:
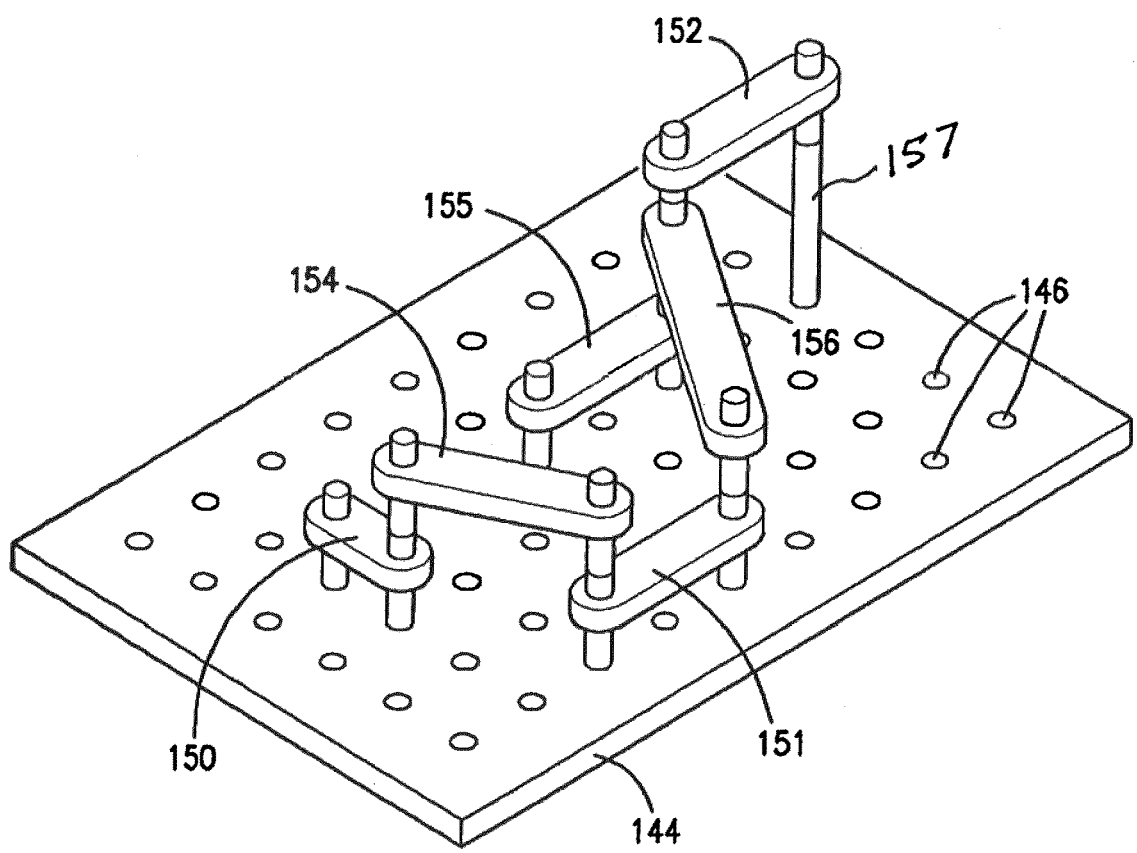
FIG. 23 is a perspective view of a base and several magnetic component connectors of FIGS. 21 and 22 mounted thereon.

Rather than, or in combination with, the magnetic component connectors being magnetically connectable to a printed circuit board or a breadboard device to interconnect the components of the magnetic component connectors, the magnetic component connectors can be configure to connect directly to one another. FIG. 21 shows a two lead magnetic component connector similar to the connectors shown in FIGS. 6-9, and FIG. 22 shows a three lead connector similar to the connector shown in FIG. 10. These connectors include an insulated leg joiner 140 with legs extending from opposite sides of the joiner, such as shown in FIGS. 21-23 as the bottom and top sides of the joiner. The legs can take the form of a short magnetic leg portion 141 extending from one side of the joiner (the bottom side as shown) and a short magnetic leg portion 142 extending from the opposite side of the joiner (the top side as shown). As with the prior magnetic component connectors, an electronic component is connected between the legs, which component can also include a wire to form a jumper. The leg portions 141 and 142 will usually be aligned and can be formed from the same leg piece extending through the connector so as to extend from both sides of the connector to form the two leg portions 141 and 142 of each leg. Magnetic component connectors with any desired number of magnetic legs can be used.

With this arrangement, the connectors can be mounted on a base 144 having securement pads 146 of a material to which magnets are attracted arranged in a grid or other arrangement pattern. These securement pads 146 can be mounted on the base merely as mounting pads with no electrical interconnection of the pads, or some of the pads may be electrically interconnected in a desired manner or pattern. The magnetic legs of various connectors can be mounted to the securement pads of the base to form a stable mounting for a circuit to be built, such as connectors 150, 151, and 155, with other connectors 154, 156, and 152 connected directly to the connectors 150, 151 and 155 through the direct connection of magnetic leg portions from each connector. Thus, the short legs extending downwardly from the ends of connector 154 in the arrangement shown in FIG. 23 are connected directly to the short legs extending upwardly from connectors 150 and 151. The short legs extending downwardly from connector 156 is secured to the short legs extending upwardly from connectors 151 and 155. The short legs extending downwardly from connector 152 are secured to the short leg extending upwardly from connector 156 and, through a magnetic leg extender 157, to the base 144. The various connectors can be connected and interconnected in various ways to create various circuits.

Rather than the securement pads 146 on the base to which component connectors can be magnetically connected to stabilize and form a base for building a circuit, a base can be provided with a plurality of holes rather that securement pads. The holes can be arranged similarly to the pads 146 in base 144 of FIG. 23, and FIG. 23 can be looked at as providing a grid of holes 146. The legs of the component connectors secured to the base 144 are then inserted into the holes 146 to mount them to the base. The component connector legs extending into the receiving holes will provide stabilization of the circuit with respect to the base. When using holes through the base to mount and stabilize the circuit being constructed, the holes and legs should be such that the legs do not extend from the bottom side of the base where, if the base is placed on an electrically conductive surface, the legs extending through the base could be accidentally shorted by the electrically conductive surface. Thus, a bottom surface, such as a non-slip or non-skid pad can be applied over the bottom surface of the base to form a bottom for each hole so that the magnetic component connector legs do not extend to or from the bottom surface, and to reduce or eliminate relative movement of the base on a supporting surface. Alternately, the base can be made thick enough so that the legs of the component connectors will not extend all of the way through the base when the component connector is mounted on the base. Where holes in the base are used, leg extenders, such as 157, can include a flange positioned similarly as the component connector joiners to limit the distance the leg extender can extend into the hole. The base can be made of various materials such as plastic or cardboard, with a piece of cardboard having a plastic sheet laminated to the top surface of the cardboard, and with holes therethrough for receiving legs of the component connectors, being an economical choice. The base could also have a rim or side to elevate it above a supporting surface similar to that shown in FIG. 27.

When the magnetic component connectors are provided with magnets as legs, generally the legs will all have the same magnetic polarity orientations, although, in some circumstances, different magnetic polarity orientations may be desired.

Whereas the invention is here illustrated and described with reference to embodiments thereof presently contemplated as the best mode of carrying out the invention in actual practice, it is to be understood that various changes may be made in adapting the invention to different embodiments without departing from the broader inventive concepts disclosed herein and comprehended by the claims that follow.

The invention claimed is:

1. A magnetic component connector for connecting electronic components to form an electronic circuit, comprising:
   a plurality of electrically conductive magnetic legs, each leg being a magnet;
   a nonelectrically conductive joiner holding the plurality of magnetic legs, the joiner having opposite sides with each magnetic leg being accessible on each of said opposite joiner sides; and
   means for electrically connecting leads of an electronic component to respective magnetic legs;
   whereby a plurality of magnetic component connectors are adapted to be magnetically interconnected by magnetically connecting one of the plurality of electrically conductive magnetic legs of one magnetic component connector directly to one of the plurality of electrically conductive magnetic legs of another magnetic component connector to form an electronic circuit.

2. A magnetic component connector for connecting electronic components to form an electronic circuit, according to claim 1, wherein each magnetic leg includes a leg portion extending outwardly from at least one of the opposite sides of the joiner.

3. A magnetic component connector for connecting electronic components to form an electronic circuit, according to claim 1, wherein each magnetic leg of the plurality of electrically conductive magnetic legs includes a first leg portion extending outwardly from one of the opposite sides of the joiner and a second leg portion forming a conductive pad accessible on the opposite side of the joiner, whereby the first leg portions of the plurality of electrically conductive magnetic legs of one magnetic component connector are adapted to magnetically connect directly to a second leg portion of another magnetic component connector.

4. A magnetic component connector for connecting electronic components to form an electronic circuit, according to claim 3, additionally including a base for stabilizing at least one magnetic component connector, said base including a plurality of base conductive contact pads of material which attracts a magnet for attracting and holding at least one first leg portion of the plurality of electrically conductive magnetic legs of at least one component connector.

5. A magnetic component connector for connecting electronic components to form an electronic circuit, according to claim 4, wherein the base is made of cardboard.

6. A magnetic component connector for connecting electronic components to form an electronic circuit, according to claim 4, wherein the base includes a circuit board on which the plurality of base conductive contact pads are formed, and means electrically interconnecting selected base conductive contact pads of the plurality of base conductive contact pads.

7. A circuit board according to claim 6, wherein the circuit board is a printed circuit board and the means interconnecting selected base conductive contact pads include electrically conductive traces on the printed circuit board.

8. A circuit board according to claim 7, wherein the printed circuit board has two broad opposing sides, wherein the conductive traces are positioned on one broad side, wherein the base conductive contact pads are positioned on the other broad side, and wherein respective base conductive contact pads are electrically connected to selected conductive traces.

9. A magnetic component connector for connecting electronic components to form an electronic circuit, according to claim 1, additionally including a base for stabilizing at least one magnetic component connector, said base including a plurality of base conductive contact pads of material which attracts a magnet for attracting and holding at least one leg of the plurality of electrically conductive magnetic legs of at least one component connector.

10. A magnetic component connector for connecting electronic components to form an electronic circuit, according to claim 9, wherein the base includes a circuit board on which the plurality of base conductive contact pads are formed, and means electrically interconnecting selected base conductive contact pads of the plurality of base conductive contact pads.

11. A circuit board according to claim 10, wherein the circuit board is a printed circuit board and the means interconnecting selected base conductive contact pads include electrically conductive traces on the printed circuit board.

12. A circuit board according to claim 11, wherein the printed circuit board has two broad opposing sides, wherein the conductive traces are positioned on one broad side, wherein the base conductive contact pads are positioned on the other broad side, and wherein respective base conductive contact pads are electrically connected to selected conductive traces.

13. A breadboard kit for assembling electronic circuits, comprising:
an interconnection sheet having a pair of power traces and a plurality of conductive interconnection contacts mounted on the interconnection sheet and insulated from the power traces;
a plurality of magnetic component connectors, each having a plurality of electrically conductive legs held in a predetermine orientation, one of either the plurality of legs or a portion of the interconnection sheet being magnets and the other being of a material to which magnets are attracted; and
a plurality of electronic components, respective electronic components having electronic component leads connected to respective legs of one of the plurality of magnetic component connectors;
whereby a selected electronic component can be connected between respective power traces and/or conductive interconnection contacts which are spaced apart in the predetermined manner by magnetic force by placing respective legs of a selected magnetic component connector having the predetermined orientation to mate with selected respective power traces and/or conductive contact pads to thereby connect circuit components to the interconnection sheet to construct a desired circuit.

14. A breadboard kit for assembling electronic circuits according to claim 13, wherein the interconnection sheet has opposite faces; wherein the power traces, and the interconnection contacts are located on one face of the interconnection sheet, and wherein the means for allowing connection of magnetic component connectors to the power traces and/or interconnection contacts by magnetic force is a base of material to which magnets are attracted positioned adjacent the opposite face of the interconnection sheet, and the interconnection sheet is of a material through which magnetic force will pass whereby a magnet will be attracted to the base through the interconnection sheet to be held against one or more selected power trace and/or interconnection contact of the interconnection sheet.

15. A breadboard kit for assembling electronic circuits according to claim 13, wherein the interconnection sheet has opposite faces; wherein the power traces and the interconnection contacts are located on one face of the interconnection sheet, and wherein the means for allowing connection of magnetic component connectors to the power traces and/or interconnection contacts by magnetic force is a magnetic base positioned adjacent the opposite face of the interconnection sheet, and the interconnection sheet is of a material through which magnetic force will pass whereby a magnetic component connector conductive leg of material which is attracted by a magnet will be attracted to the base through the interconnection sheet to be held against one or more selected power trace and/or interconnection contact of the interconnection sheet.

16. A breadboard kit for assembling electronic circuits according to claim 13, wherein the means for allowing connection of magnetic component connectors to the power traces and/or interconnection contacts by magnetic force is a material to which magnets are attracted which forms the power traces and interconnection contacts on the interconnection sheet.

17. A breadboard kit for assembling electronic circuits according to claim 13, wherein the means for allowing connection of magnetic component connectors to the power traces and/or interconnection contacts by magnetic force is a magnetic material which forms the power traces and interconnection contacts on the interconnection sheet.

18. A breadboard kit for assembling electronic circuits according to claim 13, wherein the means for allowing connection of magnetic component connectors to the power traces and/or interconnection contacts are all located on the surface of the breadboard which forms the interconnection sheet.

* * * * *